United States Patent
Zou et al.

(10) Patent No.: US 6,922,127 B2
(45) Date of Patent: Jul. 26, 2005

(54) RAISED ON-CHIP INDUCTOR AND METHOD OF MANUFACTURING SAME

(75) Inventors: Jun Zou, Urbana, IL (US); Chang Liu, Champaign, IL (US); Jose Schutt-Aine, Savoy, IL (US)

(73) Assignee: The Trustees of the University of Illinois, Urbana, IL (US)

( * ) Notice: Subject to any disclaimer, the term of this patent is extended or adjusted under 35 U.S.C. 154(b) by 279 days.

(21) Appl. No.: 10/154,447

(22) Filed: May 23, 2002

(65) Prior Publication Data

US 2003/0001712 A1 Jan. 2, 2003

Related U.S. Application Data

(60) Provisional application No. 60/292,963, filed on May 23, 2001.

(51) Int. Cl.[7] ................................................. H01F 5/00
(52) U.S. Cl. ...................... 336/200; 336/223; 336/232; 29/602.1; 29/605
(58) Field of Search ................................. 336/185, 205, 336/208, 211, 200; 439/151, 152; 29/602.1

(56) References Cited

U.S. PATENT DOCUMENTS

| | | | |
|---|---|---|---|
| 4,967,156 A | * 10/1990 | Seitz | 324/249 |
| 6,124,650 A | 9/2000 | Bishop et al. | |
| 6,184,755 B1 | 2/2001 | Barber et al. | |
| 6,230,145 B1 | 5/2001 | Tai et al. | |
| 6,362,714 B1 | * 3/2002 | Rice et al. | 336/179 |
| 6,392,524 B1 | * 5/2002 | Biegelsen et al. | 336/200 |
| 6,531,944 B1 | * 3/2003 | Maruyama | 336/192 |
| 6,633,219 B2 | * 10/2003 | Marbach et al. | 336/177 |

OTHER PUBLICATIONS

Sortor, US2003/0156003A1; Printed Circuit Board Transformer.*

Ahn et al., "Micromachined Planar Inductors on Silicon Wafters for MEMS Applications", IEEE Transactions on Industrial Electronics, vol. 45, No. 6, Dec. 1998.

Ashby et al., "High Q inductors for wireless applications in a complementary silicon biopolar process", IEEE J. Solid–State Circuits, vol. 31, No. 1, pp. 4–9, 1996.

Burghartz et al., "Microwave Inductors and Capacitors in Standard Multilevel Interconnect Silicon Technology", IEEE Transactions on Microwave Theory and Techniques, vol. 44, No. 1, Jan. 1996.

Burghartz et al., "RF Design Aspects of Spiral Inductors on Silicon", IEEE J. Solid–State Circuits, vol. 33, No. 12, pp. 2028–2033, 1998.

Comtois et al., "Applications for surface micromachined polysilicon thermal actuators and arrays", Proc. IEEE Solid–State Sensors & Actuators Workshop, pp. 174–177, 1996.

Daneman et al, "Linear microvibromotor for positioning optical components", IEEE J. Microelectromechanic. Syst., vol. 5, No. 3, pp. 159–165, 1996.

(Continued)

*Primary Examiner*—Anh Mai
(74) *Attorney, Agent, or Firm*—Greer, Burns & Crain, Ltd.

(57) ABSTRACT

A raised on-chip planar inductor. An inductor is fabricated on a substrate. The inductor, except for an anchoring extremity, is lifted from the substrate, preferably by application of a magnetic field to a magnetic layer formed on the inductor. The lifting of the inductor deforms a plastic bending region. After the magnetic field is removed, the inductor remains raised with respect to the substrate.

38 Claims, 4 Drawing Sheets

OTHER PUBLICATIONS

Fan et al., "Self–assembled microactuated XYZ stages for optical scanning and alignment", Proc. Int. Conf. Solid–State Sensors and Actuators, vol. 1, pp. 319–322, 1997.

Green et al., "Demonstration of Three–Dimensional Microstructure Self–Assembly", IEEE J. Microelectromechanic. Syst., vol. 4, No. 4, pp. 170–176, 1995.

Harsh et al., "Solder self–assembly for three–dimensional microelectromechanical systems", Sensors & Actuators A, vol. 77, pp. 237–244, 1999.

Hoffman et al., "3D structures with piezoresistive sensor in standard CMOS", Proc. IEEE Workshop on Microelectromechanical Systems, pp. 288–293, 1995.

Judy et al., "Magnetic microactuation of Polysilicon Flexure Structures", IEEE J. Microelectromechc. Syst., vol. 4, No. 4, pp. 162–169, 1995.

Liu et al., "Out–of–Plane Permalloy magnetic actuators for delta–wing control", Proc. IEEE Microelectromechanical Systems Workshop, pp. 7–12, 1995.

Liu et al., "Surface micromachined magnetic actuators" Proc. IEEE Workshop on Electromechanical Systems, pp. 57–62, 1994.

O'Sullivan et al., "Integrated, variable–reluctance magnet minimotor", IBM Journal of Research and Development, Electrochemical Microfabrication, vol. 42, No. 5, 1998.

Ozgur et al., "High Q Backside Micromachined CMOS Inductors", IEEE International Symposium on Circuits and Systems, p. 577–580, 1999.

Pister et al., "Microfabricated hinges", Sensors and Actuators A, vol. 33, No. 3, pp. 249–256, 1992.

Reid et al., "Automated Assembly of flip–up micromirrors", Proc. 1997 Int. Conf. Solid–State Sensors and Actuators, vol. 1, pp. 292–298, 1997.

Ribas et al., "Micromachined Planar Spiral Inductor in Standard GaAs HEMT MMIC Technology", IEEE Electron Device Letters, vol. 19, No. 8, Aug. 1998.

Syms, "Equilibrium of hinged and hingeless structures rotated using surface tension forces", IEEE J. Microelectromechanic. Syst., vol. 4, No. 4, pp. 177–184, 195.

Syms, "Surface tension powered self–assembly of 3–D micro–optomechanical structures", IEEE J. Microelectromechanic. Syst., vol. 8, No. 4, pp. 448–455, 1999.

Wu, "Micromachining for optical and optoelectronics systems", Proc. IEEE, vol. 85, No. 11, pp. 1833–1856, 1997.

Yi et al., Magnetic Actuation of Hinged Microstructures, IEEE J. Microelectromechanic. Syst., vol. 8, No. 1, pp. 10–17, 1999.

Yoon et al., "High–Performance Three–Dimensional On–Chip Inductors Fabricated by Novel Micromachining Technology for RF MMIC", IEEE MTT–S Digest, p. 1523–1526, 1999.

Zou et al., "Plastic Deformation Magnetic Assembly (PDMA) of 3D Microstructures: Technology Development & Application", Micro Actuator, Sensor and System Research Group, Microelectronics Laboratory, pp. 1–27.

Zou et al., "Plastic Deformation Magnetic Assembly (PDMA) of Out–of–Plane Structures: Technology & Application".

* cited by examiner

RAISED ON-CHIP INDUCTOR AND METHOD OF MANUFACTURING SAME

REFERENCE TO RELATED APPLICATIONS

This application claims the benefit of U.S. Provisional Application No. 60/292,963, filed May 23, 2001, under 35 U.S.C. §119.

STATEMENT OF GOVERNMENT INTEREST

This invention was made with government assistance from the Defense Advanced Research Program Agency (DARPA) under Grant No. F30602-97-2-2038. The government has certain rights in this invention.

FIELD OF THE INVENTION

The present invention relates generally to the field of fabrication of on-chip components for integrated circuits.

BACKGROUND OF THE INVENTION

High-performance on-chip inductors are increasingly needed for a wide range of environments, such as wireless communication systems and micro-electromechanical systems (MEMS). Planar coil inductors with moderate quality factor (Q) can be integrated with other radio frequency (RF) circuits by using standard integrated circuit (IC) fabrication processes. The effectiveness of these on-chip inductors in RF systems and other environments depends upon, among other parameters, loss, and parasitics due to the substrate on which the inductor is formed.

Typically, planar coil inductors are directly fabricated onto a dielectric layer on top of an electrically-lossy semiconductor substrate, such as silicon. This lowers the quality factor and degrades the performance of planar coil inductors by introducing extra loss, noise, and parasitic capacitance. In addition, the conventional planar coil inductor requires a significant footprint to achieve a required inductance. This reduces the overall density of integration and increases the cost of finished devices, as the semiconductor substrates are expensive.

Recently, fabrication techniques have been employed to reduce the adverse influence of the substrate, such as using a high resistivity substrate, coating organic dielectric materials such as polyimide to increase thickness of the dielectric layer underneath the inductor, and/or partially or completely removing the substrate underneath the inductor. More recently, surface micromachining technology has been applied in the fabrication of planar coil inductors to create an air gap between the inductor and the substrate. However, all of these procedures require additional fabrication steps, and many of these steps may not be compatible with standard IC fabrication processes. In other words, the chances for such processes to be accepted by standard IC foundry are minimal. Furthermore, none of these conventional methods addresses the problem of the large footprint of typical planar coil inductors.

SUMMARY OF THE INVENTION

The present invention provides an integrated circuit having a raised on-chip inductor. In a preferred method of producing the inductor according to the invention, an inductor is fabricated on a substrate. The inductor is lifted from the substrate after the fabrication process. The inductor is rotated with respect to an anchored extremity that anchors the inductor to the substrate. The anchoring extremity also may constitute one or more electrical leads. A plastic bending region of the inductor undergoes plastic deformation as the inductor is lifted with respect to the substrate into a raised position.

Because such inductors are small (on the manner of 100–1000 $\mu$m on each side), it is preferred to raise them by using methods other than manual manipulation. The inductor, according to a preferred method of the present invention, is raised by using an externally applied magnetic field. A layer of magnetic materials (for example, electroplated nickel-iron alloy) is deposited on a surface of the inductor. By applying a magnetic field, the magnetic material on the inductor will develop internal magnetization and interact with the external magnetic field. This creates a bending torque on the magnetic layer. The magnetic field is applied to the magnetic material at sufficient strength and for at least a sufficient time to induce plastic deformation in the plastic bending region, as the inductor rotates while the anchoring extremity anchors the inductor to the substrate. This plastic deformation allows the inductor to remain at a raised rest angle after the magnetic field is removed.

The raised on-chip inductor formed by the inventive method is preferably much less susceptible to loss and parasitic effects from the substrate. In addition, the raised on-chip inductor preferably has a significantly smaller footprint than conventional inductors.

The inventive method for raising the inductor may also be used to raise other microfabricated components. By forming the components on a sacrificial layer, except for an anchoring extremity, and removing the sacrificial layer, the anchored component can be fabricated. Depositing a layer of magnetic material on the component and applying a magnetic field for the magnetic layer raises the component, except for the anchoring extremity, to a raised position with respect to a surface hosting the component.

DETAILED DESCRIPTION OF THE INVENTION

Figure 1:
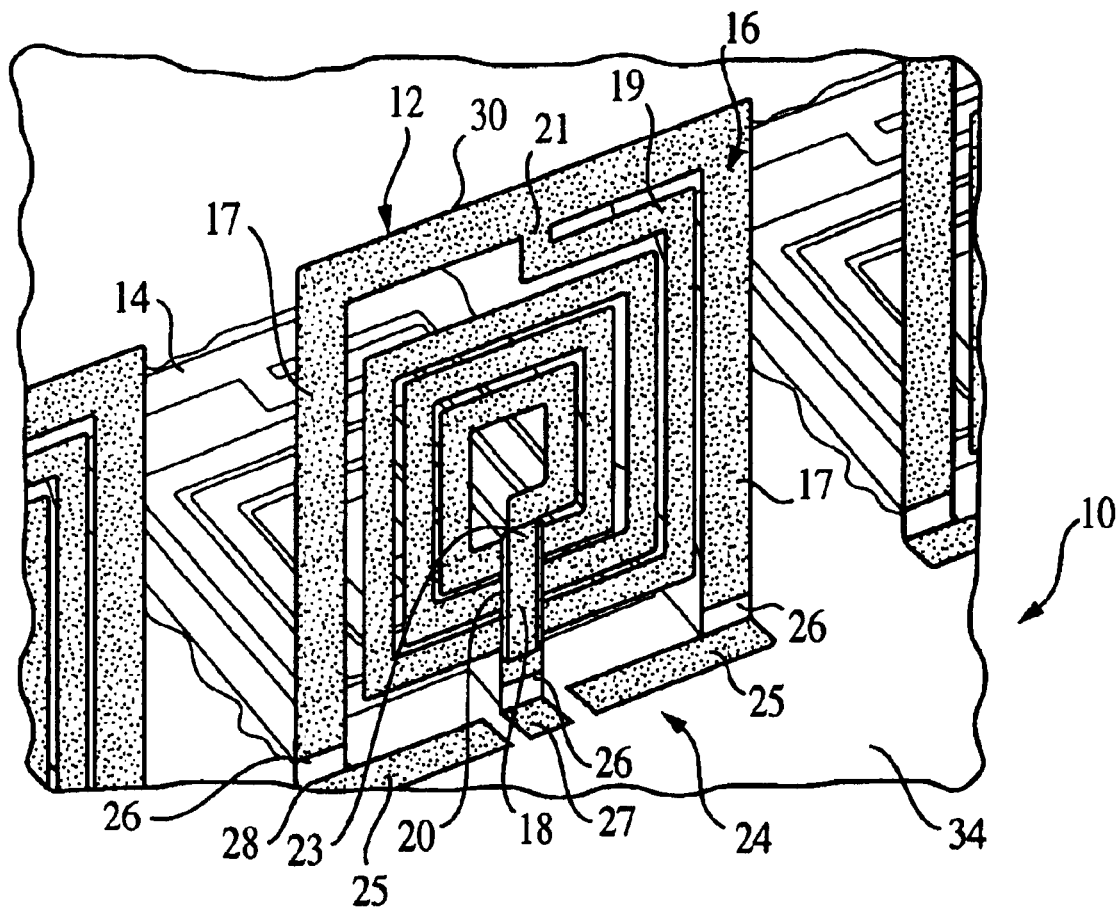
FIG. 1 shows a portion of an integrated circuit having a raised on-chip inductor according to a preferred embodiment of the present invention.

The present invention provides a raised inductor arranged at an angle with respect to the substrate that hosts it, and methods for producing the inductor. A preferred embodiment of the inductor includes at least a first conductor. The first conductor is raised with respect to the substrate, and supported by an anchoring extremity, which is preferably disposed at a foot of the inductor. As used herein, the term "raised" means that the inductor is anchored to the substrate, or supported, by the anchoring extremity but is otherwise lifted, standing, or angled with respect to the surface of the substrate.

According to a preferred process of fabricating the inductor, a planar inductor that is made of a ductile material is fabricated onto a substrate of a chip. Preferably, the ductile material can be, but is not limited to, gold, aluminum, or copper. The planar inductor includes at least a first conductor. As fabricated, the first conductor, except for the anchoring extremity, is fixed to the substrate by a sacrificial layer. Preferably, a second conductor is also fabricated, connecting an inner end of the first conductor to its periphery. The second conductor may also include a part of the anchoring extremity that anchors the inductor. Next, a layer of magnetic material is formed on a surface of the inductor, and the sacrificial layer is selectively removed. The first conductor and second conductor, except for the anchoring extremity, are detached from the substrate, preferably by removal of the sacrificial layer, so that the anchoring extremity anchors the conductor.

The planar inductor, anchored by the anchoring extremity, is lifted as one piece by application of a magnetic field. The magnetic field magnetizes the layer of magnetic materials overlapping with the inductor. The induced magnetic field then interacts with the external magnetic field. A mechanical bending torque is produced. The inductor then tends to bend in a direction that favors the alignment of the internal induced magnetic field to the external field. The inductor rotates from a distal, free end, with respect to an axis formed by the anchoring extremity. The magnetic field is applied for a sufficient time so that a plastic bending region near the anchoring extremity undergoes plastic deformation as the inductor lifts from the free end. The cantilevered inductor is lifted into a raised position with respect to the substrate.

The above method may also be used with other microfabricated objects. Generally, a magnetic field is used to interact with microfabricated objects that are connected to the substrate using cantilevers made of ductile materials, such as metal films made of gold, aluminum, or copper. The resultant mechanical torque is sufficient to cause permanent bending, or plastic bending, of the cantilever beam.

The raised on-chip inductor preferably has a much smaller footprint than conventional on-chip inductors. The inventive inductor preferably suffers significantly lower substrate parasitic loss effects than conventional on-chip inductors.

The invention will now be illustrated with respect to preferred embodiments of raised on-chip inductors and preferred methods for producing the inductors. Dimensions and illustrated devices may be exaggerated for purposes of illustration and understanding of the invention.

Referring now to the drawings, FIG. 1 shows an integrated circuit (IC) 10 having a raised on-chip inductor 12 extending from a preferably silicon planar substrate 14 of the IC according to a first preferred embodiment of the present invention. The inductor 12 shown in the exemplary embodiment of FIG. 1 is a planar inductor of a coplanar waveguide configuration. As shown in FIG. 1, the exemplary inductor 12 includes a first conductor 16 with a pair of grounding conductors 17 surrounding a center, spiral-shaped conductor 19. The grounding conductors 17 meet at an outer end 21 of the spiral conductor 19, near a distal end 30 of the inductor 12. The first conductor 16 is mechanically anchored to the substrate 14 by an anchoring extremity 24, which includes a pair of conductive pads 25 at ends (feet) of the grounding conductors 17. The pair of conductive pads 25 together forms a first terminal for the coplanar waveguide inductor. The anchoring extremity 24 of the first conductor 16 anchors the raised inductor 12 to the substrate 14, and provides electrical leads. The first conductor 16 is preferably fabricated from a ductile, plastically-deformable material, for example, gold, aluminum, or copper. Most preferably, the first conductor 16 is formed of gold, a good ductile material for plastic deformation.

A second conductor 18, which may be made of a conductive, ductile material, such as a suitable metal, electrically connects an inner end 23 of the spiral conductor 19 to the substrate 14 without electrically contacting the remainder of the first conductor 16. The second conductor 18, in the coplanar waveguide configuration shown, carries a signal from the chip 10. The second conductor 18 extends between the inner end 23 and a conductive pad 27, which forms another part of the anchoring extremity 24 that mechanically anchors the inductor 12 to the substrate 14. The conductive pad 27 also forms a second terminal for the coplanar waveguide inductor. A dielectric bridge 20 is disposed between the first and second conductors 16, 18 to electrically separate the first and second conductors. The dielectric bridge 20 in the preferred embodiment shown is formed from CYTOP, an organic material.

As can be seen in FIG. 1, the inductor 12 is anchored by the anchoring extremity 24 of the inductor 12, but is otherwise raised with respect to the substrate 14. The anchoring extremity 24 of the exemplary inductor 12 shown in FIG. 1 includes the conductive pads 25 of the first conductor 16 (part of the grounding conductors 17) and the conductive pad 27 of the second conductor 18. A plastic bending region 26 disposed near the anchoring extremity 24 cantilevers the inductor 12 and provides one or more (as shown in FIG. 1, three) conductive paths to the substrate 14. Again, preferably, the first conductor 16 and second conductor 18 are formed of a ductile, conductive material. However, it is also contemplated that, alternatively, only the plastic bending region 26 may be ductile and plastically deformable, while the remainder of the first and second conductors 16, 18 may be formed from a different, less ductile material.

Folds 28 are formed within the plastic bending region 26 at or near points of detachment between the first and second conductors 16, 18 and the substrate 14, near an edge of the anchoring extremity 24. The portion of the first conductor 16 detached from the substrate 14 extends from an edge of the anchoring extremity 24 and the plastic bending region 26, to the distal end 30 of the inductor extending across the top of the first conductor (portions of the grounding conductors 17) in the configuration shown in FIG. 1.

Preferably, the inductor 12 (including the first and second conductors 16, 18) except for the anchoring extremity 24 is oriented between 30 and 90 degrees, with respect to a plane formed by the substrate. It is preferred that the inductor 12 be oriented at least at a minimum angle $\theta_{min}$ so that plastic deformation occurs in the plastic bending region 26 during lifting of the inductor, and so that loss from the electrically-lossy substrate 14 is reduced. Most preferably, the inductor 12 is in a standing position, at or near 80–90 degrees with respect to the substrate 14. When the inductor 12 is angled within this preferred range, both losses from the substrate 14 and the footprint of the inductor are substantially minimized. However, this range of orientation angles is not required. Furthermore, the inductor 12 may be angled greater than 90 degrees with respect to the substrate 14, measured from an initial (horizontal) position of the inductor. For example, the inductor 12 may be considered raised with respect to the substrate 14 when it is angled anywhere between 30 and 150 degrees, and considered vertically-oriented (standing) at between 80 and 100 degrees.

Figure 2A:
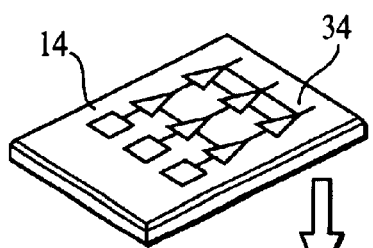
FIGS. 2(a)–2(f) are perspective views showing steps of a preferred process for producing a raised on-chip inductor according to a process of the present invention.
Figure 2D:
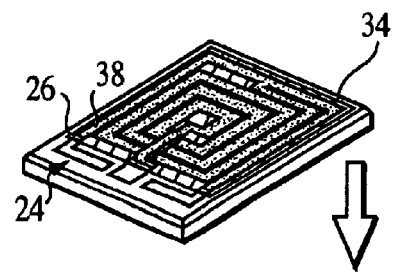
Figure 2B:
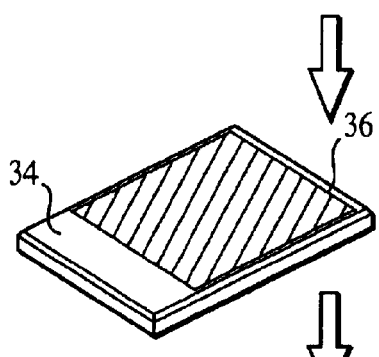

Referring now to FIGS. 2(a)–2(f) and 3(a)–3(f), a preferred process is shown for producing the raised inductor 12 on the chip 10. As shown in FIGS. 2(a)–2(b), the substrate 14, for example, a semiconductor such as an IC chip with or without circuit elements already present, is provided having a chip surface 34, preferably of silicon nitride. A sacrificial layer 36, preferably of silicon oxide, is formed on the chip surface 34. The sacrificial layer 36 is deposited onto the chip surface 34, using plasma enhanced chemical vapor deposition (PECVD) for example, and is patterned. In a possible following step, a thin (200 Å, for example) chromium film (not shown) may be deposited using thermal evaporation to improve the adhesion of the first conductor 16 (especially the anchoring extremity 24) on the silicon nitride chip surface 34, particularly if the first conductor is gold.

Figure 2E:
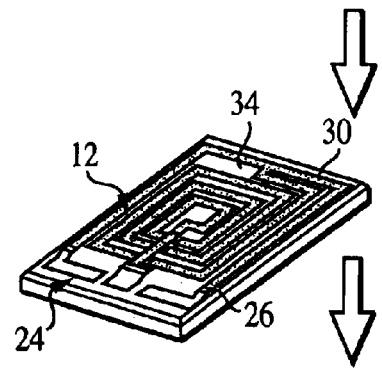
Figure 2C:
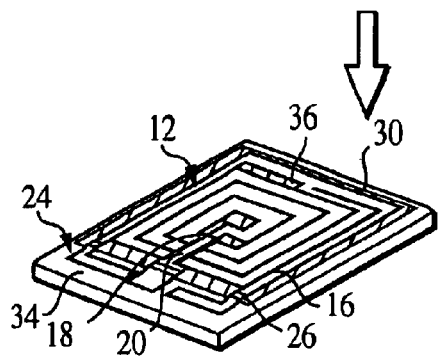
Figure 2F:
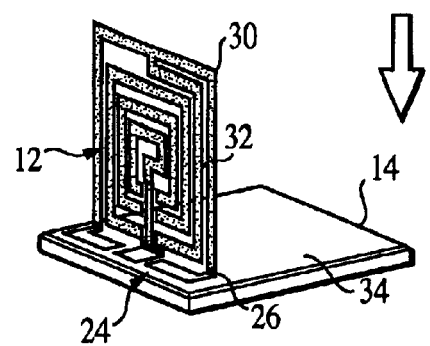

Next, as shown in FIG. 2(c), the planar inductor 12, including (in the exemplary embodiment shown) the first conductor 16, the second conductor 18, and the dielectric bridge 20, is fabricated primarily on the sacrificial layer 36, using any suitable process. However, the area of the inductor 12 forming the anchoring extremity 24, e.g. the conductive pads 25, 27, is not formed on the sacrificial layer 36, but instead is formed on the chip surface 34, (or the chromium film) so that it anchors the inductor after the sacrificial layer is removed. In one preferred method for fabricating the inductor 12, a gold film is deposited on the sacrificial layer 36 and on the chip surface 34 by using thermal evaporation, and the film is patterned to form the first conductor 16. The dielectric bridge 20 and the second conductor 18 are formed in any suitable manner. The planar inductor 12 as shown in this step of the process is oriented horizontally with respect to the chip surface 34.

Figure 3A:
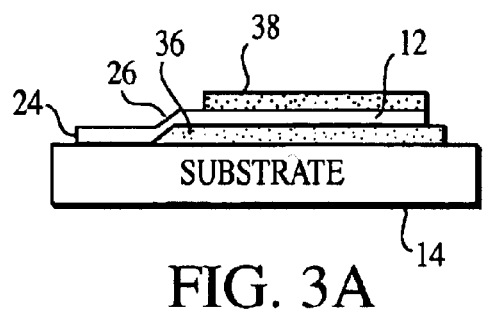
FIGS. 3(a)–3(d) are schematic side views of some of the steps of the preferred process shown in FIGS. 2(a)–2(f)

After fabrication of the inductor 12, and as shown in FIGS. 2(d) and 3(a), a magnetic layer 38 is formed on an inductor surface 32. The magnetic layer 38 is any suitable magnetic material piece that is deposited or otherwise formed on the inductor 12. Preferably, the material for the magnetic layer 38 is Permalloy ($Ni_{80}$—$Fe_{20}$), which is electroplated onto the gold first conductor 16. Alternatively, many other permanent magnetic materials or ferromagnetic materials can be used. The magnetic layer 38 preferably has a substantially greater thickness $t_p$ than the thickness $t_g$ of the inductor 12, particularly the first conductor 16. For example, the first conductor 16 thickness $t_g$ may be 0.5 $\mu$m thick, while the thickness $t_p$ of the magnetic layer 38 may be 4–7 $\mu$m thick. As shown in FIG. 2(c), the magnetic layer 38 covers most of the exposed inductor surface 32 after fabrication, including most of the first conductor 16 (except for the portion covered by the second conductor 18) and the surface of the second conductor, but the magnetic layer preferably does not cover the plastic bending region 26 or the anchoring extremity 24.

In this way, the plastic bending region 26 is defined by portions of the first conductor 16 and the second conductor 18 that are disposed on the sacrificial layer 36 and substantially uncovered by the magnetic layer 28. The length of the plastic bending region 26 is short compared to the overall length of the inductor surface 32 extending from the anchoring extremity 24 to the distal end 30. This substantially facilitates the plastic deformation of the plastic bending region 26 when the inductor 12 is raised. In addition, by directly attaching the magnetic layer 38 to the inductor 12, additional substrate space on the chip 10 is not required for a microactuator or similar device.

Figure 3B:
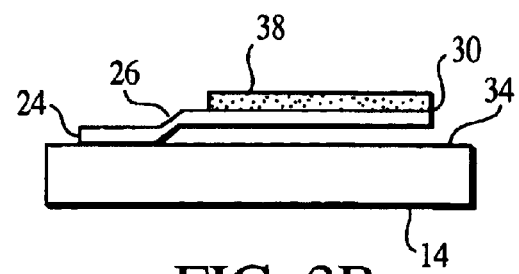

As shown in FIGS. 2(e) and 3(b), the sacrificial layer 36 is removed to release the inductor 12, including the distal end 30 but not including the anchoring extremity 24, from the substrate 14. The inductor 12 is then anchored to the substrate 14 by the anchoring extremity 24. In a preferred embodiment, the sacrificial layer 36 is etched in a liquid solution, such as HF or water solutions, to release the inductor 12. The chip 10 and the inductor 12 may be dried after the sacrificial layer 36 is removed, using a super critical carbon dioxide dryer, for example. If the drying step is included, the inductor 12 is raised in air. However, the drying step is not necessary, or preferred. Instead, it is preferred that the inductor 12 is raised while the chip 10 is in liquid.

Figure 3C:
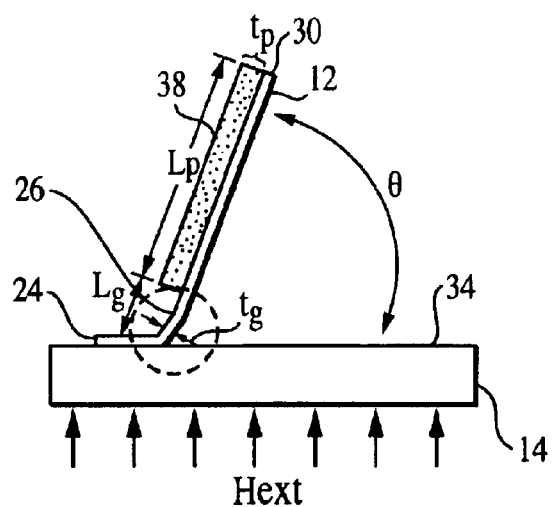

After the sacrificial layer 36 is removed, and as shown in FIG. 3(c), a magnetic field $H_{ext}$ is applied to the magnetic layer 38 on the inductor surface 32 to lift the cantilevered inductor 12 from the substrate 14, producing the raised inductor. The inductor 12 lifts from the distal end 30 as the anchoring extremity 24 anchors the inductor 12 to the substrate 14. The plastic bending region 26 disposed near the point of detachment from the substrate 14 (near the anchoring extremity 24) initially undergoes elastic deformation, and then plastic deformation. The magnetic field $H_{ext}$ may be applied immediately after the sacrificial layer 36 is etched and rinsed, which allows the anchored inductor 12 to stay out of the substrate surface 34 thereafter. This prevents stiction between the inductor 12 and the substrate surface 34, which otherwise may interfere with the lifting of the inductor 12.

In a preferred embodiment, an electromagnet, such as an industrial strength electromagnet powered by a suitable power supply, generates the magnetic field $H_{ext}$. In a process performed by the present inventors, the electromagnet was powered by an HP® 6200B DC (direct current) power supply. Preferably, the electromagnet is configured and disposed with respect to the chip 10 to generate a magnetic field $H_{ext}$ that is substantially uniform and perpendicular to the upper surface of the substrate, as shown in FIG. 3(c). The electromagnet is preferably disposed underneath the chip 10 so that the magnetic field $H_{ext}$ contains a vector component that lies in a direction perpendicular to the surface of the substrate 14, though the direction of the $H_{ext}$ may be changed to, for example, further alter a bending angle of the inductor 12.

The magnetic layer 38 on the inductor surface 32 is internally magnetized in the external magnetic field $H_{ext}$ and interacts with the magnetic field, as the magnetic force tries to align the cantilevered inductor 12 to the magnetic field. As a result, a torque $T_m$ is generated in the magnetic layer 38 to bend the inductor 12, particularly the plastic bending region 26, and lift the inductor off the substrate 14. The inductor 12, from the distal end 30, rotates with respect to an axis formed by the anchoring extremity 24, bending at the plastic bending region 26, and creating a bending angle θ, as shown by example in FIG. 3(c). The bending angle θ of the inductor 12 increases with $H_{ext}$. The magnetic field $H_{ext}$ is applied at least a sufficient time so that the plastic bending region 26 is bent into the plastic deformation regime. This allows the inductor 12 to remain at a particular rest angle φ (shown in FIG. 3(d)) after the magnetic field $H_{ext}$ is removed. The final rest angle φ is typically smaller than the maximum value of the bending angle θ due to bending relaxation caused by the release of the elastic energy stored during the application of the magnetic field $H_{ext}$.

Both the bending angle θ and the rest angle φ are related to the geometry and properties of the plastic bending region 26 and the magnetic layer 38, as well as the applied magnetic field $H_{ext}$. Thus, a ductile material such as gold, aluminum, or copper having a short relative length, is preferred for facilitating plastic deformation. In addition, the magnetic field $H_{ext}$ should be applied globally so that, if more than one structure is being assembled, they can be assembled in parallel.

As shown in FIG. 3(c), the length of the raised inductor surface 32 extending from the point of detachment to the substrate 14 to the distal end 30 includes the length $l_g$ of the gold (for example) plastic bending region 26 and the length $l_p$ of the Permalloy-covered inductor surface 32. The height h of the raised inductor 12 is measured from the chip surface 34 to the distal end 30. Thus, the bending angle θ of the raised inductor 12 can be obtained by $$\theta = \sin^{-1}\left(\frac{h}{l_g + l_p}\right).$$

Because the thickness of the magnetic layer 38 is preferably significantly greater than the thickness of the inductor 12, nearly all of the bending of the inductor caused by the torque $T_m$ generated in the magnetic layer 38 occurs within the uncovered plastic bending region 26, and the bending behavior of the inductor is mainly determined by the plastic bending region. More particularly, the length $l_g$ of the gold plastic bending region 26 is a determinative factor of φ. Inductors 12 with smaller $l_g$ exhibit larger φ.

The torque $T_m$ can be estimated by $$T_m = MV_m H_{ext} \cos \theta,$$

where M is the magnetization of the magnetic layer 38, and $V_m$ is the volume of the magnetic layer. M increases with θ until it reaches a saturation value $M_s$. The $M_s$ for Permalloy $Ni_{80}$—$Fe_{20}$ is about 1 Tesla. Assuming the inductor 12 (particularly the first conductor 16 and second conductor 18) has ideal plastic and elastic behaviors, as $T_m$ increases, the bending of the plastic bending region 26 is first in the elastic regime and then changes into the plastic regime. This transition occurs when the maximum stress of the plastic bending region 26 exceeds the yield stress of the plastic bending region.

In the elastic bending regime, the relationship between the bending angle θ and the torque $T_m$ depends upon the Young's modulus and the moment of inertia of the inductor 12, as well as the geometry of the magnetic layer 38. An equation can thus be derived for estimating the magnetic field $H_{ext}$ for a particular bending angle θ for a certain inductor or other component. Furthermore, the bending angle θ as a function of the magnetic field $H_{ext}$ can be estimated. By determining a relationship between the amount of plastic deformation and a particular magnetic field $H_{ext}$, a plastic deformation process can be designed and implemented for a particular microstructure to achieve a desired rest angle φ.

The bending process of the inductor 12 can be divided into three general phases. In Phase I (for example, θ<30°), the bending angle θ increases slowly with $H_{ext}$ because the magnetic layer 38 is not fully magnetized (M<$M_s$) when θ is small. In Phase II (such as 30°<θ<60°), θ increases faster with $H_{ext}$ than in Phase I because the magnetic layer 38 has been fully magnetized (M=$M_s$). In Phase III (for example, θ>60°), the " cos θ" term in the $T_m$ equation begins to dominate and θ starts to saturate. The bending angle θ eventually reaches its maximum value. In the same magnetic field $H_{ext}$, a larger magnetic layer 38 can generate a larger torque, resulting in a larger saturation value of θ.

Figure 3D:
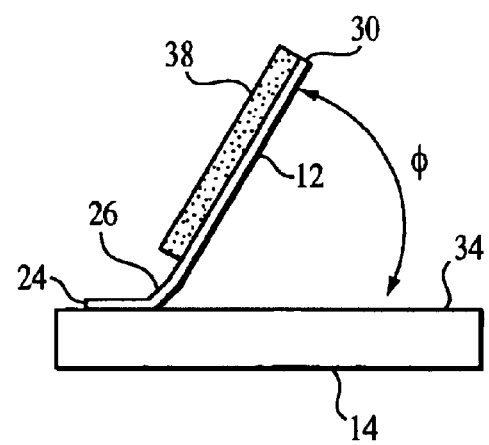

After $H_{ext}$ is removed, the raised inductor 12 will relax to the rest angle φ, as shown in FIG. 3(d), since the elastic energy stored during the bending will be released. The rest angle φ is related to bending occurring in the plastic regime. Thus, θ can be determined by the difference between the maximum bending angle and the bending angle occurring at the yielding point.

Figure 4A:
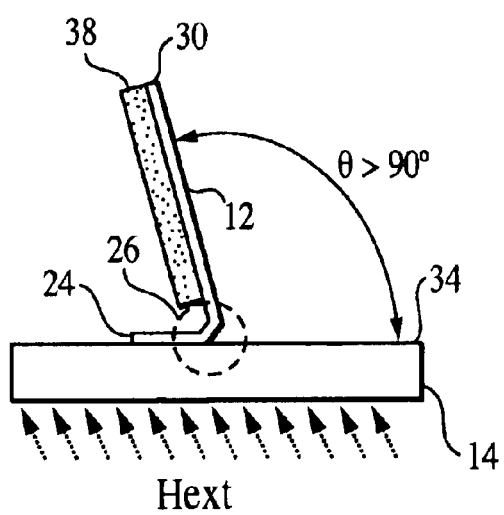
FIGS. 4(a)–4(b) are schematic side views of steps of a process for moving a raised inductor into a substantially perpendicular position.
Figure 4B:
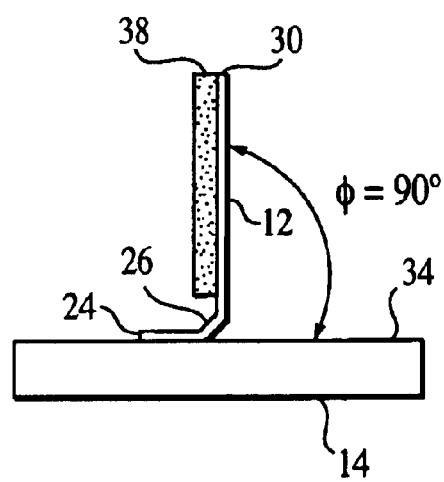

Preferably, the current supplied to the electromagnet is increased slowly so that the loading can be considered being increased in a quasi-static state. If so, the maximum bending angle θ and the maximum rest angle φ are smaller than the angle of the magnetic field $H_{ext}$ (preferably 90 degrees). However, the rest angle φ can be increased, and approach 90 degrees (a completely vertical inductor 12), by using a very short plastic bending region 26 (for example, $l_g$=10 μm), and/or by changing the direction of the magnetic field $H_{ext}$, as shown in FIGS. 4(a) and 4(b). In FIG. 4(a), the magnetic field $H_{ext}$ is moved to a second angle greater than 90 degrees so that the bending angle θ of the raised inductor 12 increases to an angle greater than 90 degrees. Preferably, a portion of the bending angle θ greater than 90 degrees is due to the elastic deformation of the bending inductor 12. When the magnetic field $H_{ext}$ is removed, the stored elastic energy causes the raised inductor 12 to return to a resting angle φ of about 90 degrees, as shown in FIG. 4(b) as well as FIG. 3(f).

Once the inductor 12 is raised to a raised position, the magnetic layer 38 may be removed, if desired. The assembled inductor 12 may also be coated with a Parylene gas-phase coating, for example, to strengthen the assembled structure. However, this step is not required.

Instead of, or in addition to, bending deformation, other types of deformation, such as torsion, may be used to lift the inductor 12 to a raised position. In addition, the process described above may be modified to produce other types of raised and/or three-dimensional components. Also, though the description herein primarily describes production of the raised inductor 12, the present invention contemplate raising a variety of microfabricated components by fabricating the components on a sacrificial layer except for an anchoring extremity, forming a layer of magnetic material on the component, removing the sacrificial layer to release the (anchored) component, and lifting the component by application of a magnetic field to induce plastic deformation in a plastic bending region of the component. The process can be tailored to meet the requirements of a specific fabrication process.

Because the raised on-chip inductor 12 preferably has a footprint only in the area of the anchoring extremity 24 of the inductor, additional room is created for additional components on the integrated circuit 10. A resting angle φ at or near 90 degrees maximizes a number of additional components that can be formed on a particular substrate.

In addition, because the inductor surface 32 preferably does not face the substrate 14, but instead is raised with respect to the substrate, the inductor is much less vulnerable to substrate loss effects. This increases the quality factor (Q) of the inductor 12, among other benefits, making the raised inductor well-suited for wireless communication, MEMS, and other uses. If the inductor 12 is oriented at or near 90 degrees, which is preferred, the loss effects from the substrate 14 are minimized.

The preferred plastic deformation process used to lift the inductor 12 to a raised, and preferably, vertical position uses one structural layer and one sacrificial layer 38, as opposed to some prior art microassembly processes that require multiple structural and sacrificial layers. In addition, if a conductive metal is used for the plastic bending region 26, good electrical connection results between the cantilevered, raised inductor 12 and the substrate 14. Furthermore, the preferred plastic deformation process can be performed at room temperature, and without mechanical slacks. The preferred process is compatible with IC fabrication processes, and can be used for batch-scale assembly to produce novel micro-devices and micro-components with high yield, good controllability, and good repeatability.

While specific embodiments of the present invention has been shown and described, it should be understood that other modifications, substitutions, and alternatives are apparent to one of ordinary skill in the art. Such modifications, substitutions, and alternatives can be made without departing from the spirit and scope of the invention, which should be determined from the appended claims.

Various features of the invention are set forth in the appended claims.

What is claimed is:

1. An inductor disposed on a substrate, the inductor comprising:
   a conductor;
   an anchoring extremity that mechanically anchors said conductor to the substrate;
   said conductor being otherwise raised with respect to the substrate so that said conductor is in an angled position that is not parallel to the substrate.

2. The inductor according to claim 1 wherein the inductor, except for said anchoring extremity, is detached from the substrate.

3. The inductor according to claim 2 wherein said inductor further comprises:
   an additional conductor electrically connected to said conductor, said additional conductor including a part of said anchoring extremity and having a plastic bending region near said anchoring extremity.

4. The inductor according to claim 3 wherein the inductor further comprises:
   a dielectric bridge disposed between said conductor and said additional conductor.

5. The inductor according to claim 2 wherein said conductor is comprised of a ductile metal.

6. The inductor according to claim 1 wherein the inductor is a planar spiral inductor.

7. The inductor according to claim 6 wherein said conductor is connected to said anchoring extremity via a plastic bending region near said anchoring extremity.

8. A method of forming an inductor on a substrate, comprising the steps of:
   fabricating said inductor on the substrate, said inductor being anchored to the substrate by an anchoring extremity but otherwise detached from said substrate; and
   lifting said inductor, except for said anchoring extremity, to plastically deform said inductor and lift said inductor, anchored by said anchoring extremity, into a raised position with respect to the substrate.

9. The method of claim 8 wherein said step of lifting said inductor comprises the step of:
   applying a magnetic field to said inductor to lift said inductor from said substrate.

10. The method of claim 9 wherein said applying step is maintained at least until part of said inductor is plastically deformed.

11. The method of claim 9 wherein said step of fabricating said inductor further comprises the step of:
   forming a layer of magnetic material on a surface of said inductor.

12. The method of claim 11 wherein said magnetic material is not formed on a plastic bending region of said inductor disposed near said anchoring extremity.

13. The method of claim 12 wherein said plastic bending region comprises a ductile metal.

14. The method of claim 12 further comprising the step of:
   producing plastic deformation in said plastic bending region while lifting said inductor.

15. The method of claim 11 wherein said magnetic material is at least eight times thicker than a thickness of said inductor.

16. The method of claim 11 wherein said step of applying said magnetic field comprises the step of applying a magnetic field, said magnetic field containing a vector component that lies in a direction perpendicular to said surface of said substrate.

17. The method of claim 16 further comprising the steps of:
   moving a direction of said magnetic field to rotate said inductor to an angle greater than 90 degrees with respect to said substrate; and
   removing said magnetic field so that said inductor reverts to an angle of substantially 90 degrees with respect to said substrate.

18. The method of claim 9 wherein said step of applying said magnetic field further comprises the step of:
   increasing said magnetic field as said inductor lifts with respect to said substrate.

19. The method of claim 8 wherein said step of fabricating comprises the step of:
   forming a first conductor and a second conductor on said substrate.

20. The method of claim 19 further comprising the step of:
   forming a dielectric bridge disposed between said first conductor and said second conductor.

21. The method of claim 8 wherein said fabricating step further comprises the steps of:
   forming a sacrificial layer on said substrate; and
   forming said inductor on said sacrificial layer, except for said anchoring extremity.

22. The method of claim 21 further comprising the step of:
   removing said sacrificial layer to release said inductor, except said anchoring extremity, from said substrate.

23. An integrated circuit having an inductor formed by the steps of:
   fabricating a planar inductor on a substrate including a conductor extending between an anchoring extremity and a distal end; and
   lifting said distal end while said anchoring extremity remains connected to said substrate to plastically deform said planar inductor and lift said inductor, except for said anchoring extremity, into a raised position with respect in said substrate.

24. The integrated circuit of claim 23 wherein said step of lifting said distal end comprises the step of:
   applying a magnetic field to said planar inductor to lift said distal end of said planar inductor.

25. The integrated circuit of claim 24 wherein the inductor is formed by the further step of:
   forming a magnetic layer on said surface of said planar inductor.

26. A method of producing a microfabricated component on a substrate, the method comprising:
   fabricating the component on a sacrificial layer, except for an anchoring extremity, the sacrificial layer being on or above the substrate;
   forming a layer of magnetic material on the component;
   removing the sacrificial layer to release the component, the component remaining anchored to the substrate at least by the anchoring extremity;
   lifting the component by application of a magnetic field to induce plastic deformation in a plastic bending region of the component and raise the component, except for the anchoring extremity, with respect to the substrate.

27. An integrated inductor disposed on a substrate, the inductor comprising:
   a first conductor including an anchoring extremity that mechanically anchors said first conductor to the substrate, the first conductor being otherwise raised with respect to the substrate;
   wherein said first conductor, except for said anchoring extremity, is detached from the substrate;
   wherein said inductor further comprises a second conductor electrically connected to said first conductor, said second conductor including a part of said anchoring extremity and having a plastic bending region near said anchoring extremity.

28. The inductor according to claim 27 wherein said inductor further comprises:
   a dielectric bridge disposed between said first conductor and said second conductor.

29. A method of forming an inductor on a substrate, comprising the steps of:
   fabricating a planar inductor on the substrate, said planar inductor being anchored to the substrate by an anchoring extremity but otherwise detached from said substrate; and
   lifting said planar inductor, except for said anchoring extremity, to plastically deform said planar inductor and lift said planar inductor, anchored by said anchoring extremity, into a raised position with respect to the substrate;
   wherein said step of lifting said planar inductor comprises the step of applying a magnetic field to said planar inductor to lift said inductor from said substrate;
   wherein said step of fabricating said planar inductor further comprises the step of forming a layer of magnetic material on a surface of said planar inductor.

30. The method of claim 29 wherein said magnetic material is not formed on a plastic bending region of said planar inductor disposed near said anchoring extremity.

31. The method of claim 30 wherein said plastic bending region comprises a ductile metal.

32. A method of forming an inductor on a substrate, comprising the steps of:
   fabricating a planar inductor on the substrate, said planar inductor being anchored to the substrate by an anchoring extremity but otherwise detached from said substrate; and
   lifting said planar inductor, except for said anchoring extremity, to plastically deform said planar inductor and lift said planar inductor, anchored by said anchoring extremity, into a raised position with respect to the substrate;
   wherein said step of lifting said planar inductor comprises the step of applying a magnetic field to said planar inductor to lift said planar inductor from said substrate;
   wherein said step of applying said magnetic field further comprises the step of increasing said magnetic field as said inductor lifts with respect to said substrate.

33. The method of claim 29 wherein said step of applying said magnetic field comprises the step of applying a magnetic field, said magnetic field containing a vector component that lies in a direction perpendicular to said surface of said substrate.

34. The method of claim 33 further comprising the steps of:
   moving a direction of said magnetic field to rotate said inductor to an angle greater than 90 degrees with respect to said substrate; and
   removing said magnetic field so that said inductor reverts to an angle of substantially 90 degrees with respect to said substrate.

35. The method of claim 29 wherein said magnetic material is at least eight times thicker than a thickness of said planar inductor.

36. A method of forming an inductor on a substrate, comprising the steps of:
   fabricating a planar inductor on the substrate, said planar inductor being anchored to the substrate by an anchoring extremity but otherwise detached from said substrate; and
   lifting said planar inductor, except for said anchoring extremity, to plastically deform said planar inductor and lift said planar inductor, anchored by said anchoring extremity, into a raised position with respect to the substrate;
   wherein said step of fabricating comprises the step of forming a first conductor and a second conductor on said substrate.

37. The method of claim 36 further comprising the step of:
   forming a dielectric bridge disposed between said first conductor and said second conductor.

38. The method of claim 30 further comprising the step of:
   producing plastic deformation in said plastic bending region while lifting said inductor.

* * * * *

UNITED STATES PATENT AND TRADEMARK OFFICE
CERTIFICATE OF CORRECTION

PATENT NO. : 6,922,127 B2
DATED : July 26, 2005
INVENTOR(S) : Zou et al.

It is certified that error appears in the above-identified patent and that said Letters Patent is hereby corrected as shown below:

Column 10,
Line 47, please delete "in" and insert -- to -- therefor.

Signed and Sealed this

Thirteenth Day of December, 2005

JON W. DUDAS
*Director of the United States Patent and Trademark Office*

UNITED STATES PATENT AND TRADEMARK OFFICE
CERTIFICATE OF CORRECTION

PATENT NO. : 6,922,127 B2 Page 1 of 1
APPLICATION NO. : 10/154447
DATED : July 26, 2005
INVENTOR(S) : Zou et al.

It is certified that error appears in the above-identified patent and that said Letters Patent is hereby corrected as shown below:

In the Issued Patent:

On the face, under Assignee, please insert --Board of-- between "The" and "Trustees."

In col. 10, line 47, please delete "in" and insert --to-- therefor.

Signed and Sealed this

Twentieth Day of March, 2007

JON W. DUDAS
*Director of the United States Patent and Trademark Office*